(12) United States Patent
Gundlach et al.

(10) Patent No.: US 6,984,446 B2
(45) Date of Patent: Jan. 10, 2006

(54) PROCESS FOR PRODUCING A METAL LAYER ON A SUBSTRATE BODY, AND SUBSTRATE BODY HAVING A METAL LAYER

(75) Inventors: Harald Gundlach, Grunwald (DE); Andreas Muller-Hipper, Regensburg (DE); Ewald Simmerlein-Erlbacher, Pegnitz (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/916,321

(22) Filed: Aug. 11, 2004

(65) Prior Publication Data

US 2005/0052326 A1    Mar. 10, 2005

Related U.S. Application Data

(63) Continuation of application No. PCT/DE02/03201, filed on Aug. 30, 2002.

(30) Foreign Application Priority Data

Sep. 17, 2001 (DE) ................................ 101 45 750

(51) Int. Cl.
*B32B 31/30* (2006.01)
*B32B 33/00* (2006.01)
*B29C 71/00* (2006.01)

(52) U.S. Cl. ...................... 428/323; 428/141; 428/206; 428/209; 427/123; 427/203; 427/404; 427/437; 264/211.14; 264/211.12

(58) Field of Classification Search ................ 427/202, 427/203, 404, 437, 97.7, 98.6, 99.2, 123; 428/548, 614, 620, 621, 141, 206, 209, 323; 264/211.14, 211.12
See application file for complete search history.

(56) References Cited

U.S. PATENT DOCUMENTS

| | | | |
|---|---|---|---|
| 2,897,409 | A | 7/1959 | Gitto |
| 3,391,455 | A | 7/1968 | Hirohata et al. |
| 3,506,482 | A | 4/1970 | Hirohata et al. |
| 3,574,068 | A | 4/1971 | Chessin |
| 4,411,980 | A | 10/1983 | Haney et al. |
| 4,454,168 | A | 6/1984 | Fritz |
| 4,560,445 | A | 12/1985 | Hoover et al. |
| 5,421,989 | A | 6/1995 | Stamp et al. |
| 6,171,468 | B1 | 1/2001 | Thorn et al. |
| 6,414,596 | B1 | 7/2002 | Altwasser et al. |
| 2005/0034995 | A1 * | 2/2005 | Gunlach et al. |

FOREIGN PATENT DOCUMENTS

| | | |
|---|---|---|
| DE | 448 210 | 8/1927 |
| DE | 196 29 269 A1 | 1/1998 |
| DE | 196 39 232 A1 | 3/1998 |
| DE | 196 39 646 A1 | 4/1998 |

(Continued)

OTHER PUBLICATIONS

"Additive Plating for Thermoplastic Carriers"; Research Disclosure, Kenneth Mason Publication, Hampshire, GB, Nr. 314, Jun. 1, 1990, p. 459, XP.

*Primary Examiner*—Jennifer McNeil
*Assistant Examiner*—Jason L. Savage
(74) *Attorney, Agent, or Firm*—Darby & Darby

(57) ABSTRACT

Process for producing a metal layer on a substrate body. The process includes applying conductive particles to a surface of the substrate body, so that the conductive particles are fixed to the substrate body, and metallizing the substrate body together with the particles chemically and/or by electrodeposition in a metallization bath so as to form the metal layer.

12 Claims, 2 Drawing Sheets

FOREIGN PATENT DOCUMENTS

| | | |
|---|---|---|
| DE | 198 06 360 A1 | 9/1998 |
| DE | 198 10 809 A1 | 12/1999 |
| DE | 198 33 593 A1 | 1/2000 |
| DE | 198 41 804 A1 | 3/2000 |
| EP | 0 570 062 A1 | 11/1993 |
| EP | 0 647 729 A1 | 4/1995 |
| EP | 0 726 337 A1 | 8/1996 |
| EP | 0 913 711 A1 | 5/1999 |
| GB | 2 087 654 A1 | 5/1982 |
| WO | WO-92/19092 A1 | 10/1992 |
| WO | WO-92/21118 A1 | 6/1997 |
| WO | WO-99/65002 A1 | 12/1999 |
| WO | WO-01/54226 A1 | 7/2001 |

* cited by examiner

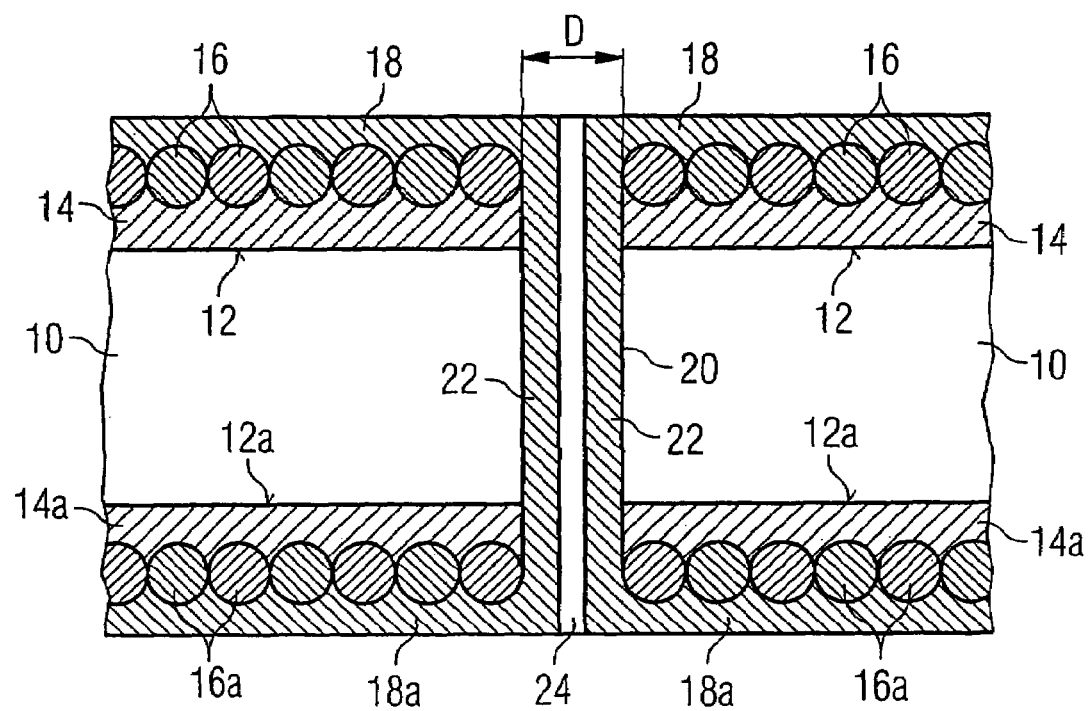

PROCESS FOR PRODUCING A METAL LAYER ON A SUBSTRATE BODY, AND SUBSTRATE BODY HAVING A METAL LAYER

CROSS-REFERENCE TO RELATED APPLICATION

This application is a continuation of International Patent Application Serial No. PCT/DE02/03201, filed Aug. 30, 2002, which published in German on Apr. 3, 2003 as WO 03/027353, and is incorporated herein by reference in its entirety.

FIELD OF THE INVENTION

The invention relates to a process for producing a metal layer on a substrate body, in which the metal layer can be produced either in structured form or over the entire surface. The invention also relates to a substrate body having a structured metal layer or a metal layer over the entire surface.

BACKGROUND OF THE INVENTION

Various processes are known from the prior art for production of a metal layer on a substrate body. Many of these proposals deal with the way in which structured metal layers, for example in the form of antenna coils or flat coils, can be produced. The term "structured metallization" is to be understood in the text which follows as meaning all profiles of conductor runs which are conceivably possible. The antenna coils are used, for example, in what are known as contactless chip cards or RFID tags. Antennas of this type, which do not necessarily have to have a coil-like profile (for example dipole antennas), are also used in security tags in department stores. Furthermore, a structured metallization according to the above definition may be any conductor run layout which is required, for example, to connect a plurality of electronic components on a printed-circuit board.

A known process for producing a structured metal layer on a substrate body, as carried out in the production of an antenna coil for a contactless chip card, is to be described briefly below.

An aluminium foil with a thickness of 25 to 50 µm is laminated on to both sides of a substrate body which consists of a nonconductive material and has a thickness of approximately 30 to 50 µm. Initially, therefore, the structure is a laminate which has a metallization over the entire surface of the two main sides of the substrate body. To produce the structured metallization, an etching resist is applied to those sides of the aluminium layers which are remote from the main surfaces of the substrate body, and the resist is then exposed by photolithography. In the subsequent etching step, those regions of the aluminium layers covering the entire surface which are not required for a conductor run are etched away. After the etching resist which has remained on the structured metallization has been removed, the desired conductor structure is complete. The process described, which makes use of a subtractive principle, has the drawback that only low throughput rates can be achieved, a high consumption of chemicals is required and large parts of the raw materials used (aluminium layer) are wasted on account of the subtractive process. A process of this type is known, for example, from DE 196 29 269 A1.

An alternative process for the production of a structured metal layer consists in conductive pastes which are provided with conductive metal particles being applied in ready-structured form to a substrate body. The application may in this case be effected by means of a printing operation. Examples are given in WO 99/65002, DE 198 41 804 or WO 97 21118.

Conductive pastes have the drawback of having a high electrical resistance. Furthermore, they are generally very expensive, since the conductive particles usually consist of silver, and the proportion of silver in the conductive paste is over 90%. Moreover, on account of the high electrical resistance, it is necessary to bring about reinforcement by electrodeposition, so that a conductive layer, for example of copper, is formed on the conductive paste and is subsequently responsible for the actual electrical function. The conductive particles in the conductive paste consequently serve only to allow the growth of the metal layer by means of an electrodeposition operation. In addition to the high costs, the high thickness of >50 µm of the conductive paste is also worth noting, with the result that the thickness of the structure comprising substrate body and metal layer increases.

Another process is given in DE 198 10 809 C1. In this process, a metal powder layer is applied to the top side of a substrate film, and the top side of the substrate film, which has been covered with the metal powder, is then exposed by means of an imaging unit using electromagnetic radiation at the locations which correspond to the conductor tracks of the predetermined conductor structure. The metal powder is partially melted in the regions which have been exposed by the electromagnetic radiation, so that the melted metal powder is fixedly joined to the substrate film. Then, the substrate film is guided around a guide roller, so that the top side of the substrate film is oriented downwards, during which process the metal powder which is not joined to the substrate film is detached therefrom under the force of gravity, so that only the structured metal layer remains on the substrate film. The metal powder which falls off is collected and returned for reuse. It is unlikely that all the unmelted metal powder will drop off the top side under the force of gravity, and consequently further work is required.

SUMMARY OF THE INVENTION

Therefore, an object of the present invention is to provide a process for producing a metal layer on a substrate body with which it is relatively simple and inexpensive to produce a metal layer with a low electrical resistance on a substrate body. Furthermore, the process is also to allow inexpensive production of structured metal layers.

A further object of the invention is to describe a substrate body having a metal layer which has a low electrical resistance and is inexpensive to produce.

An inventive process for producing a metal layer on a substrate body provides for:
- conductive particles to be applied to a surface of the substrate body, so that they are fixed to the substrate body; and
- the substrate body together with the particles to be metallized chemically and/or by electrodeposition in a metallization bath so as to form the metal layer.

The step of applying the conductive particles to a surface of the body in this case takes place not with the aid of an embedding compound which surrounds the conductive particles, as is the case, for example, with conductive pastes. Rather, the conductive particles are applied to the surface of the substrate body in "uncovered" form, i.e. without an embedding material surrounding them. They may be applied, for example, by being blown, sprayed, rolled or brushed on. Of course, other possible options which ensure that the "uncovered" metal particles are applied to the surface of the substrate body in such a manner that they are fixed to the substrate body are also conceivable.

To achieve sufficient bonding of the conductive particles to the surface of the substrate body, the metal particles may be applied to the substrate body by thermal and/or static and/or magnetic means and/or by means of a bonding layer. The conductive particles may consist, for example, of metal, preferably of copper, iron, nickel, gold, silver, aluminium, brass or an alloy, of graphites or of conductive polymer particles. The particles are preferably in powder form.

In a first variant, the substrate body preferably consists of plastic, the surface of the substrate body having adhesive properties. The activation of the adhesive properties of the surface of the substrate body, which consists of plastic, may be effected, for example, by softening it. The surface may be softened, by way of example, by means of thermal radiation, by means of ultrasound or by means of a solvent. For this purpose, the surface of the substrate body may be pretreated with a solvent. Alternatively or in addition, the conductive particles may also be pretreated with a solvent before being applied to the substrate body. It is also conceivable for the conductive particles to be applied to the substrate body together with a solvent.

According to a further configuration of the invention, it is provided for the substrate body, which consists of plastic, to be discharged from an extruder and for the surface of the substrate body to be covered with the conductive particles once it emerges from the extruder. After the plastic has emerged from the extruder, the plastic is not yet in a cured state. If the conductive particles are blown or centrifuged, sprayed, rolled or brushed on to the surface of the substrate body, the conductive particles can penetrate partially into the surface of the substrate body, resulting in the particles adhering to the substrate body in such a manner that, after the substrate body has cured, they can no longer be detached therefrom without the action of further mechanical forces.

If the entire surface of the substrate body is to be metallized, the application of the particles must take place in such a manner that they also cover the entire surface of the substrate body. Those particles which cannot come into contact with the substrate body itself during application to the surface, but rather come into contact with other—nonadhesive—particles, will not stick, on account of the absence of adhesion to the substrate body. These conductive particles can be reused after they have been removed. They may be removed, by way of example, by suction or by the force of gravity.

According to the first variant, in a further configuration there is provision for the plastic substrate body which has been covered with the conductive particles then to be calendered.

In another variant of the process according to the invention, there is provision for a bonding layer with adhesive properties, to which the conductive particles are fixed, to be applied to the surface of the substrate body. Accordingly, the bonding layer is applied to the surface of the substrate body before the conductive particles are applied and fixed to the bonding layer.

The bonding layer should be selected in such a manner that it is matched both to the materials properties of the substrate body and to those of the conductive particles. Therefore—in part in order to match mechanical demands—the bonding layer may be composed of two or more layers which lie on top of one another and may consist of different materials. Where the following text refers to the bonding layer, this is to be understood as meaning both a single-layer and a multilayer bonding layer.

Providing the bonding layer on the surface of the substrate body has the advantage that the substrate body can consist of any desired material. According to the invention, the substrate body may consist of a metal, a ceramic, a wood, a stone, a textile or also, as in the first variant, a plastic. The list of materials used for the substrate body should in no way be considered conclusive, since the process according to the invention can be applied to any desired material. The bonding layer used may be an adhesive, a paint, a gold size or any other desired material whose adhesive properties are sufficient to ensure the application and bonding of the conductive particles, which takes place by blowing, spraying, rolling or brushing them on. The bonding layer may be applied by printing, for example stencil printing, screen printing, letter press printing, gravure printing, planographic printing or inkjet printing, by spraying, if appropriate with the aid of stencils, or by a plotter.

It becomes clear just from this list that the described process is suitable not only for the production of a metal layer over the entire surface, but rather the production of structured metal layers is also extremely easily possible. The reinforcing by electrodeposition, i.e. the formation of the metal layer in a metallization bath, takes place only at those locations at which conductive particles are arranged on the surface of the substrate body. If the bonding layer is now applied in ready-structured form to the surface of the substrate body, the conductive particles are likewise fixed only at those locations at which the bonding layer has been applied. At the locations at which conductive particles come into direct contact with the surface (which does not have adhesive properties) of the substrate body, they do not stick. Accordingly, the metal layer is also not formed at these locations.

As in the first variant, when using a bonding layer, it is also conceivable for the adhesive properties of this bonding layer only to be activated by softening the surface which is remote from the substrate body. Accordingly, the activation may be effected by thermal radiation, by ultrasound or by a solvent. The application of the conductive particles to the bonding layer may then take place together with the solvent. Of course, in this embodiment, it is also conceivable for the conductive particles to be pretreated with a solvent before they are applied to the substrate body.

There is no need to activate the adhesive properties of the bonding layer if the bonding layer applied to the surface of the substrate body has not yet cured and in the meantime the conductive particles have been applied closely together to the bonding layer. The fixing of the conductive particles is then ensured after the bonding layer has cured. The bonding layer could also have long-term adhesive properties or could consist of a permanently elastic material which does not cure, for example butyl.

It is expedient if the conductive particles are chemically or chemophysically matched to the metal layer which is to be produced.

Softening the bonding layer has the advantage of allowing good anchoring between this layer and the conductive particles. The anchoring can be promoted further if pressure is exerted on the conductive particles after they have been applied to the substrate body or the bonding layer. This can be achieved, for example, by exerting the pressure mechanically, for example using a roller.

The application of the conductive particles, particularly if they are metal particles, preferably takes place without oxides, under an oxidation-preventing atmosphere. However, it has emerged that metal particles are often already oxidized when they are applied to the bonding layer or the surface of the substrate body. However, the oxidation on the metal particles disappears again with the subsequent metallization bath and the metallization by chemical and/or electrodeposition means so as to form the metal layer, with the result that a metal layer with oxide-free metal particles below it is formed.

The conductive particles which, by way of example, are in powder form may also be dissolved in a volatile substance (for example water or solvent) which can be removed subsequently, i.e. after application to the substrate body or the bonding layer.

As has already been explained above, the metal layer in the metallization bath is formed only where conductive particles have been applied to the substrate body or the bonding layer. This allows simple structuring of the metal layer, since the fixing of the conductive particles makes it possible to control the locations at which the metal layer is to be formed. On the other hand, this discovery means that the conductive particles should be close together, i.e. if possible should be in electrical contact with one another. If gaps are formed between the conductive particles when they are being applied, this does not cause problems provided that the gaps do not exceed a predetermined size, for example the mean diameter of a particle. Ideally, however, the conductive particles are applied in such a manner that the particles are in contact with one another.

The process according to the invention has the advantage that it can easily be carried out with relatively little outlay on equipment. Substrate bodies of any desired dimensions can be provided with a desired metal layer without problems, and the metal layer is securely fixed to the substrate body. For example, it is readily possible for one or more conductive metal layers, if appropriate consisting of different materials, to be applied to the substrate body. Structureless sheet-like metal layers can be used, for example, for motor vehicle rims or for elements which serve to screen electromagnetic radiation. Structured metal layers are used, for example, in electrical or electronic circuits, such as for example antenna coils for chip card inlays. Further advantages of the process according to the invention are low costs, on account of an additive process combined, at the same time, with high working speeds. The process can be used with only a small consumption of chemicals, and is therefore environmentally friendly. Extremely high reliabilities can be achieved on account of the intimate bonding between the metal layer and the substrate body. Furthermore, it is possible to use existing manufacturing installations, in particular with regard to the electrodeposition.

Furthermore, the invention proposes a substrate body having a metal layer which is applied to a surface of the substrate body, in which conductive particles are provided between the metal layer and the surface of the substrate body, the conductive particles being arranged directly, i.e. without a carrier material embedding them, on the substrate body.

The substrate body is distinguished by the fact that it has a low height compared to conventionally produced substrate bodies. It is suitable for all applications which require only a low height, as is the case, for example, in the production of antennas for chip cards. On account of existing ISO standards, the height, i.e. the thickness, of chip cards of this type is limited to 700 $\mu$m. The use of a substrate body according to the invention now makes it possible for the covering layers of a chip card to be made thicker, so that the stability and therefore also reliability of the chip card can be increased. Thinner structured layers also facilitate the simultaneous pressing of a plurality of chip cards above one another, since the layers are applied in a reduced thickness.

In an advantageous configuration of the substrate body, a bonding layer, to which conductive particles are secured by adhesion, is arranged on the surface of the substrate body.

In a further advantageous configuration, the conductive particles are at least partially pressed into the surface of the substrate body or into the bonding layer. It is not necessary for the conductive particles to be pressed in to equal depths or to be formed uniformly in terms of their surface area.

In a preferred configuration, the conductive particles are in platelet form. Such a form allows the conductive particles to be arranged in an imbricated manner on the substrate body in order to form a particle layer. This ensures in a simple manner that the conductive particles lie close together, i.e. in direct contact with one another. As has already been explained above, this is a precondition for the formation of a uniform metal layer on the substrate body.

In principle, the particle layer formed by the conductive particles may be of any desired height. However, it has emerged that a particle layer with a thickness of less than 5 $\mu$m is sufficient for it to be possible to form a metal layer of any desired thickness on the substrate body. The smaller the thickness of the particle layer, the smaller the thickness of the overall substrate body with the metal layer applied to it can be made.

According to the invention, the substrate body may be of any desired surface shape. In many cases, the substrate body will have a planar surface. However, it is also readily possible for the metal layer to be produced on a curved or completely three-dimensional surface.

In a further advantageous configuration, it is provided that the carrier body has a particle layer formed by conductive particles on each of two opposite surfaces, on each of which a metal layer is arranged and in the region of which an opening passing through the substrate body is provided, at least the walls of the opening being lined with a conductive layer which is in electrical contact with the metal layers on the surfaces of the substrate body, and the conductive layer being formed by electrodeposition in the same process step as the metal layers.

In other words, a substrate body which has a metal layer on the two opposite surfaces, which are electrically connected to one another by a through-plated hole, is proposed. The electrical contact made by the through-plated hole can easily be produced in one step together with the production of the metal layers on the surfaces in the metallization bath. Therefore, the substrate body produced in this way is extremely simple and inexpensive to produce, and at the same time has a high level of reliability with respect to mechanical loads, on account of the continuous metal structure.

Further details, advantages and features of the invention will emerge from the following description of three embodiments of substrate bodies, which are illustrated in part in the drawing in greatly enlarged form, not to scale, and which are each provided with a metal layer.

BRIEF DESCRIPTION OF THE DRAWINGS

FIG. 3 shows a third embodiment, in which a substrate body is metallized on two sides.

DETAILED DESCRIPTION OF THE PREFERRED MODE OF THE INVENTION

Figure 1:
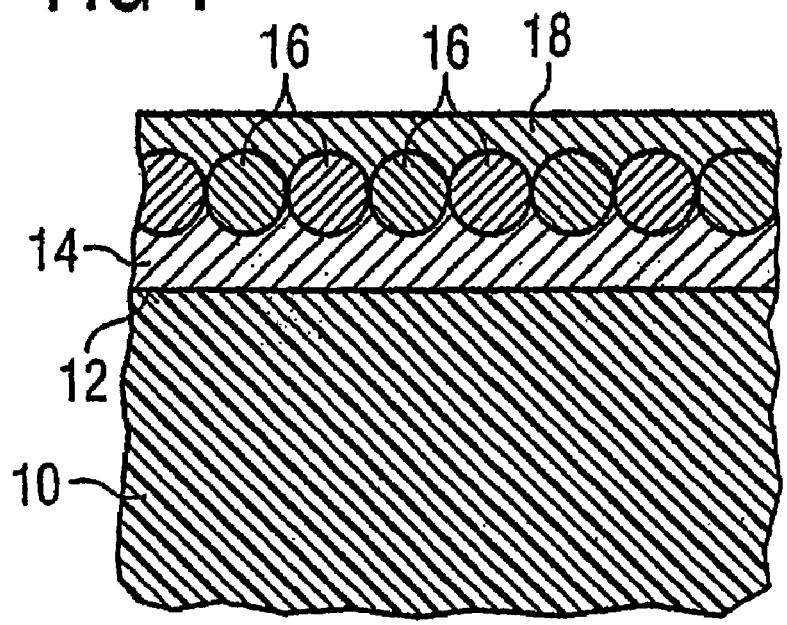
FIG. 1 shows a first embodiment, in which a substrate body is provided with a bonding layer to which conductive particles are applied.

FIG. 1 shows a sectional illustration of part of a substrate body 10, to the surface 12 of which a bonding layer 14 has been applied in a first process step. In a subsequent, second process step, conductive particles 16 have been applied close together to the optionally structured bonding layer 14. In the present exemplary embodiment, the conductive particles 16 are round in cross section. However, the cross section of the conductive particles could be of any desired form. The conductive particles 16, which consist, for example, of copper, iron, nickel, gold, silver, aluminium, brass or any other desired alloy, are fixed to the bonding layer 14. The conductive particles could also be graphites or polymers which are in powder form and are applied, for example, by being blown, sprayed, rolled or brushed on.

The conductive particles 16 are fixed to the bonding layer 14 for example as a result of the application of the particles 16 taking place during a phase in which the bonding layer 14 has not yet cured. Another possible option is for the bonding layer 14 arranged on the surface 12 of the substrate body 10 initially to be cured and at a later time to be softened by means of a suitable solvent, by means of ultrasound or by means of thermal radiation, after which the conductive particles are then applied closely together. After the softened bonding layer 14 has been cured, the particles 16 are then fixed to the bonding layer 14, having been pressed slightly into the latter, as can be seen from FIG. 1.

The substrate body 10 with the particles 16 fixed to the bonding layer 14 is then introduced into a metallization bath, with a metal layer 18 being formed chemically and/or by electrodeposition at the particles 16, which lie close together. The metal layer 18 forms a fixed bond with the conductive particles 16, so that an object with a substrate body 10 of any desired material which is designed with a metal layer 18 at its surface 12 results. The substrate body 10 may consist, for example, of metal, glass, wood, plastic, stone or textile. The substrate body also does not have to have a planar surface, as suggested by FIG. 1. The substrate body 10 may be of any desired three-dimensional form.

The metal layer 18 is formed only at those locations at which the conductive particles 16 are arranged. The fact that the conductive particles 16 are joined to the substrate body 10 or the bonding layer 14 by an adhesive force means that it is easy to structure the metal layer 18. If regions of the substrate body 10 are not provided with an adhesive surface, particles do not remain in place at these locations during application of the conductive particles 16. Therefore, there is also no metal layer 18 formed at these locations.

For this reason, on the other hand, it should be ensured that the conductive particles 16 are arranged close together on the bonding layer 14. Relatively small gaps between individual conductive particles are harmless. Larger gaps (for example gaps larger than the mean diameter of the conductive particles) should be avoided, however, in order to obtain a homogeneous, planar metal layer 18.

Figure 2:
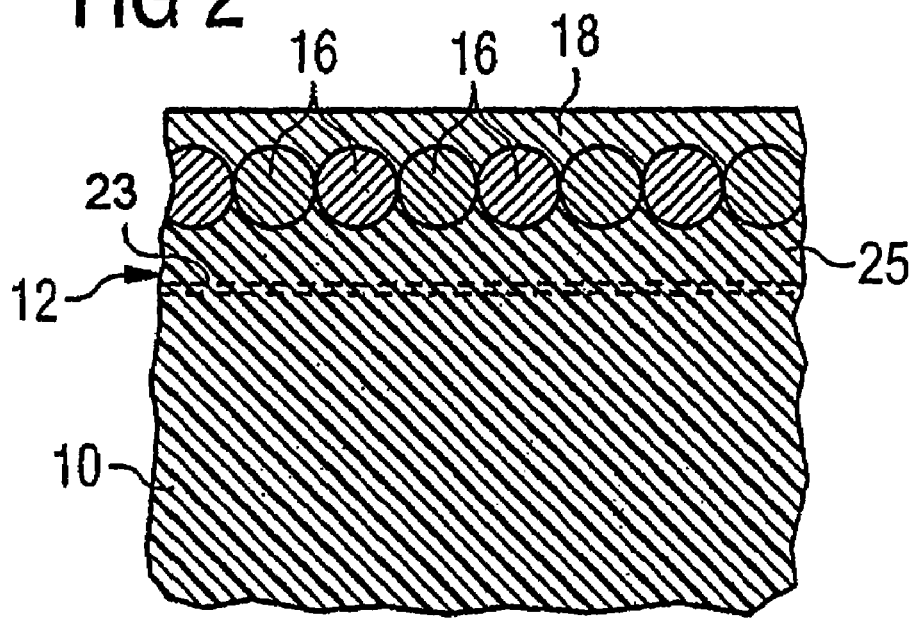
FIG. 2 shows a second embodiment, in which conductive particles are applied directly to a substrate body made from plastic.

FIG. 2 shows a second embodiment of the invention, in which the conductive particles 16 are applied direct to the surface 12 of a substrate body 10. For this purpose, the surface 12 of the substrate body 10 must have adhesive properties. This is generally only the case if the substrate body 10 consists of a plastic. To form the metal layer 18 which lies on the conductive particles 16 as in the previous example, in a first process step the substrate body 10 is softened at its surface 12. The softening of the surface 12 of the substrate body 10 may be effected by thermal radiation, ultrasound or a solvent. The corresponding softening zone is denoted by reference numeral 25. The softened region of the substrate body is delimited from the remainder of the substrate body 10 by the thin dashed lines 23. The metal particles 16 are applied close together to the softened surface 12 of the substrate body. As in the first exemplary embodiment, this can be effected by blowing, spraying, rolling or brushing them on. It is also conceivable for the metal particles to be provided with a solvent before they are applied to the surface of the substrate body. After the solidification of the softened zone 25, the conductive particles 16 are fixed to the surface 12 of the substrate body 10. The metal particles 16 are applied close together to the softened surface 12 of the substrate body. As in the first exemplary embodiment, this can be effected by blowing, spraying, rolling or brushing them on. It is also conceivable for the metal particles to be provided with a solvent before they are applied to the surface of the substrate body. After the solidification of the softened zone 20, the conductive particles 16 are fixed to the surface 12 of the substrate body 10.

In the second embodiment, structuring of the metal layer 18 becomes possible as a result of the softening of the surface of the substrate body taking place in accordance with the desired structure. Then, in the unsoftened regions of the surface, there is no bonding between the conductive particles 16 and the surface 12 of the substrate body 10, so that there is also no layer of metal formed at these locations in the subsequent metallization bath. Structuring could also be carried out by applying metal particles to the entire substrate body and then producing the desired structures by ultrasound, thermal energy or the like as a result of the conductive particles being fused to the bonding layer or the substrate body. The surplus particles can then, for example, be washed or sucked off.

The bonding of the conductive particles 16 to the surface of the substrate body or the bonding layer can be improved by exerting mechanical pressure on the particles 16 after they have been applied, with the result that they are partially pressed into the surface of the substrate body.

The substrate body which has been prepared in accordance with FIG. 1 or 2, i.e. has been provided with the conductive particles 16, is then introduced into a metallization bath, in order to produce the metal layer 18 chemically and/or by electrodeposition at the conductive particles 16 which have been provided close together. Depending on the metallization bath, the metal layer 18 may, for example, be a copper, aluminium or chromium layer. Of course, the metal layer 18 may also consist of any other desired metal, such as copper, silver or the like.

FIG. 3 shows a third exemplary embodiment, in which in addition to the surface 12, the opposite surface 12a of the substrate body 10 is also provided with a bonding layer 14a on which conductive particles 16a are arranged. Furthermore, the substrate body has an opening 24 which passes all the way through it. The opening 20 is likewise provided in the bonding layers 14 and 14a.

During the electroplating of the substrate body 10 together with the conductive particles 16, 16a situated thereon, the metal layer 18 or 18a is formed not only in the region of the conductive particles 16 but also in the interior of the opening 20.

At least the walls of the opening 20 are lined with a conductive layer 22. In the present exemplary embodiment, a region 24 which is not filled by the conductive layer 22 remains. How large the region 24 is or indeed whether the region 24 is present at all is dependent on the diameter D of the opening 20. In any event, electrical connection of the metal layers 18 and 18a by means of the conductive layer 22 is ensured if the thickness of the substrate body 10 is no greater than 100 $\mu$m. If the wall of the opening is provided with a bonding agent and therefore with metal particles, the thickness of the substrate body is of no importance. This is because the metal particles are drawn into the opening during a stamping operation which takes place after the metal particles have been applied, with the result that during the electrodeposition an electrical connection is formed between the metal layers 18, 18a.

The exemplary embodiment shown in FIG. 3 can advantageously be used for the production of antenna coils for contactless chip cards, since this generally requires the substrate body to be metallized on two sides.

What is claimed is:

1. A process for producing a metal layer on a substrate body, comprising the steps of:
    discharging the substrate body, which consists of a plastic, from an extruder,
    applying conductive particles to a surface of the substrate body by covering the surface with the conductive particles once the substrate body emerges from the extruder, without a carrier material in which the particles are embedded, so that the conductive particles are fixed to the substrate body; and
    metallizing the substrate body together with the particles chemically and/or by electrodeposition in a metallization bath so as to form the metal layer.

2. The process according to claim 1, wherein the surface of the substrate body has adhesive properties.

3. The process according to claim 1, further comprising the step of calenderizing the plastic substrate body, which has been covered with the conductive particles.

4. The process according to claim 1, wherein the conductive particles are applied by being blown, sprayed, rolled, or brushed on.

5. The process according to claim 1, further comprising the step of, after the conductive particles have been applied to the substrate body, exerting pressure on the conductive particles in order to strengthen the bonding of the conductive particles to the substrate body.

6. A device comprising:
    a substrate body, which consists of plastic and is discharged from an extruder;
    a metal layer applied to a surface of the substrate body;
    conductive particles provided between the metal layer and the surface of the substrate body,
    wherein the conductive particles are arranged directly on the substrate body, without a carrier material in which the particles are embedded, by covering the surface of the substrate body once the substrate body emerges from the extruder.

7. The device according to claim 6, wherein the conductive particles are at least partially pressed into the surface of the substrate body.

8. The device according to claim 6, wherein the conductive particles are in platelet form.

9. The device according to claim 8, wherein the conductive particles are arranged in imbricated form on the substrate body and form a particle layer.

10. The device according to claim 9, wherein the particle layer formed by the conductive particles has a thickness of less than 5 $\mu$m.

11. The device according to claim 6, wherein the substrate body has a planar, curved, or completely three-dimensional surface.

12. A device comprising:
    a substrate body, which consists of plastic and is discharged from an extruder;
    a particle layer formed by conductive particles on each of two opposite surfaces of the substrate body, wherein the conductive particles are arranged directly on the substrate body, without a carrier material in which they are embedded, by covering the surfaces of the substrate body once the substrate body emerges from the extruder
    a metal layer formed on each of the particle layers; and
    an opening, which passes through the substrate body, formed in a region of the particle layers, wherein at least walls of the opening are lined with a conductive layer which is in electrical contact with each of the metal layers on the surfaces of the substrate body,
    wherein the conductive layer is formed by electrodeposition in a same process step as the metal layers.

* * * * *